United States Patent [19]
Glatfelter et al.

[11] Patent Number: 5,468,988
[45] Date of Patent: * Nov. 21, 1995

[54] LARGE AREA, THROUGH-HOLE, PARALLEL-CONNECTED PHOTOVOLTAIC DEVICE

[75] Inventors: Troy Glatfelter, Royal Oak; Mark Lycette, Berkley, both of Mich.

[73] Assignee: United Solar Systems Corporation, Troy, Mich.

[ * ] Notice: The portion of the term of this patent subsequent to Feb. 15, 2011, has been disclaimed.

[21] Appl. No.: 206,071

[22] Filed: Mar. 4, 1994

[51] Int. Cl.⁶ .............................. H01L 27/14; H01L 31/00
[52] U.S. Cl. .................. 257/431; 136/249; 136/244; 257/448; 257/459
[58] Field of Search .................... 136/249, 244; 257/431, 448, 459

[56] References Cited

U.S. PATENT DOCUMENTS 4,532,371  7/1985  Hanak et al. .................. 136/249
5,131,954  7/1992  Yogeli et al. ................... 136/244
5,268,037  12/1993  Glatfelter ....................... 136/249

FOREIGN PATENT DOCUMENTS 59-208790  11/1984  Japan .

*Primary Examiner*—Sara W. Crane
*Assistant Examiner*—Nathan K. Kelley
*Attorney, Agent, or Firm*—Gifford, Krass, Groh, Sprinkle, Patmore, Anderson & Citkowski

[57] ABSTRACT

A large area photovoltaic device includes a plurality of photovoltaic regions electrically interconnected in parallel. The regions are defined by through hole connections which establish electrical contact between a top transparent electrode and a monolithic metal substrate. A second terminal is provided by a bottom, metallic electrode disposed upon an electrically insulating layer supported on the metallic substrate.

12 Claims, 3 Drawing Sheets

LARGE AREA, THROUGH-HOLE, PARALLEL-CONNECTED PHOTOVOLTAIC DEVICE

FIELD OF THE INVENTION

This invention relates generally to semiconductor devices and more particularly to photovoltaic devices. Most specifically, the invention relates to a large area of photovoltaic devices comprised of a number of photovoltaic regions disposed upon a common, electrically conductive substrate and interconnected in a parallel relationship by through-hole connections.

BACKGROUND OF THE INVENTION

Photovoltaic devices provide a non-polluting, silent and reliable source of electrical power. Originally, photovoltaic devices were fabricated from crystalline materials and, as a consequence, were expensive and restricted in size. Techniques have now been developed for the preparation of large area, thin film semiconductor materials which may be advantageously fabricated into low cost, large are a photovoltaic devices.

It is frequently desirable to subdivide large area photovoltaic devices into a plurality of electrically interconnected small area devices disposed upon a common substrate. The structure of these arrays makes them more tolerant of defects in the photovoltaic material and allows for the selection of desired voltage and/or current outputs. In some instances, the small area devices of an array are interconnected in a series arrangement so as to provide for an increased voltage. In other instances, particularly for low voltage, high current applications such as electrochemical processes, a parallel-connected array is desired. A parallel-connected array provides a constant voltage which is independent of device area. While a single, large area body of photovoltaic material will provide a high current at a low voltage, it is still desirable to configure the material into an array of interconnected regions. Configuring a large area of body of photovoltaic material as a parallel-connected array allows for localization of defective regions in the photovoltaic material so that such defects may be readily removed without affect upon the remainder of the device.

Photovoltaic devices, and particularly thin film photovoltaic devices usually include a transparent, electrically conductive top electrode for collecting photogenerated current therefrom. The transparent, electrically conductive electrode material is generally of modest electrical conductivity, and large area devices must include current carrying structures such as grid lines, bus bars and the like for decreasing the series resistance thereof. These structures are fabricated from opaque materials and their presence upon the light incident surface of the photovoltaic device represents a loss of active area. Therefore, the prior art necessitated a balance between maximizing the active area of a photovoltaic device and minimizing its series resistivity. Furthermore, subdividing large area material into a plurality of devices involves scribing away portions of the semiconductor material, and the scribed regions also represent photovoltaically inactive areas. Clearly, it would be desirable to maximize the active area of photovoltaic devices by limiting the size of these inactive areas, while maintaining low series resistivity.

Laser scribing techniques are often employed in the fabrication of large area photovoltaic arrays since a laser can scribe precise, fine lines in the photovoltaic material at a fairly low cost, thereby minimizing the expense of device fabrication and maximizing active area. Problems have been encountered in connection with many prior art laser scribing techniques, because of the high levels of localized heating produced by the laser beam. Such heating can cause metal electrodes to melt and short circuit the device. Also, the laser can induce unwanted crystallization of amorphous semiconductor materials thereby increasing their electrical conductivity and creating shunted current paths which degrade device efficiency. U.S. Pat. No. 5,268,037, referred to hereinabove describes a parallel-connected array, preferably fabricated by a laser scribing process. The array is defined by a plurality of finely scribed lines which subdivide a large area body of photovoltaic material into a series of discrete photovoltaic devices electrically connected in parallel. While the method described therein provides efficient and reliable photovoltaic devices, it has been found that some problems can occur as a result of material being "thrown" during the laser ablation process used for forming the scribed lines. The thrown material can interfere with subsequent deposition steps and/or obscure portions of the photovoltaic device thereby reducing its active area. Also, the scribed lines themselves, while fairly narrow, do represent a loss of generating capacity which amounts to roughly 4% of the surface area of the device. Clearly, it would be desirable to minimize both the amount of thrown material and the inactive area.

The present invention provides an improved configuration of parallel-connected array in which subdivision and interconnection is accomplished by a series of spaced apart through-holes. Use of the through-hole connections effectively subdivides the photovoltaic material into separate photovoltaic regions and provides a shortened current path through the transparent conductive layer, thereby eliminating the need for any metallic, top surface mounted, current-collecting structures.

Through connections have previously been employed in connection with photovoltaic devices for a variety of purposes, and in a variety of configurations. U.S. Pat. No. 4,865,999 of Xi shows a photovoltaic device which includes a series of point contacts therethrough for establishing electrical communication between a current collecting grid and a transparent electrode. The point contacts are manufactured from a printed conductive ink, and are relatively large in diameter and widely spaced. U.S. Pat. No. 4,981,525 of Kiyama discloses a series-connected array of photovoltaic devices, in which each of the individual devices includes a number of through-hole connections for carrying current from the transparent conductive electrode to a subjacent current-collecting structure. The through-hole connections are fairly large and widely spaced. In most instances, the device is fabricated upon a transparent, electrically conductive substrate, and the through-hole connections establish communication between a top metallic electrode and the bottom transparent electrode. Several embodiments are shown wherein the device is fabricated upon a bottom, metallic electrode; however, this electrode is a relatively thin metallic body supported upon an electrically insulating substrate. It has been found that structures of this type are incompatible with high-speed laser processing, because of the impossibility of preventing damage to the thin metallic bottom layer.

It is to be appreciated that there is a need for parallel-connected monolithic arrays of photovoltaic devices which may be readily manufactured by high-speed laser patterning processes. It is further desirable that the structure minimize the amount and effects of thrown material and not require any undue caution in the fabrication thereof. As will be detailed hereinbelow, the present invention provides for a parallel-connected photovoltaic array which may be readily fabricated by a laser patterning process. The device makes efficient use of material and is easy to fabricate. These and other advantages of the present invention will be readily apparent from the drawings, discussion and description which follow.

BRIEF DESCRIPTION OF THE INVENTION

There is disclosed herein a large area photovoltaic device which comprises a monolithic, metallic substrate member; an electrically insulating layer covering a top surface of the substrate and a bottom electrode layer covering a top surface of the electrically insulating layer. The bottom electrode layer has a first hole, having a diameter "$D_1$" defined therethrough so as to expose an edge portion of the bottom electrode layer about the periphery of the hole. The device further includes a semiconductor body disposed upon the bottom electrode layer. The semiconductor body at least partially fills the first hole and covers the edge portion of the bottom electrode layer. The semiconductor layer includes a second hole defined therethrough. The second hole is generally concentric with the first hole and has diameter "$D_2$" which is less than $D_1$. The second hole extends through the insulating layer and has a portion of the substrate exposed at the bottom thereof. The device further includes a transparent, electrically conductive layer disposed atop the semiconductor layer. The transparent, electrically conductive layer at least partially fills the second hole and establishes electrical contact with the portion of the substrate exposed therein.

In a particular embodiment, the diameter of the first hole is in the range of 25–75 microns and the diameter of the second hole is in the range of 10–50 microns. In one particular embodiment, the bottom electrode layer includes a plurality of first holes and the semiconductor layer includes a corresponding plurality of second holes each concentric with a respective one of said first holes. The spacing of the holes of the first plurality is in the range of 1–5 millimeters.

In particular embodiments, the substrate thickness ranges from 3–10 mils. The device may further include an encapsulant layer disposed upon a transparent conductive layer. The layer of bottom electrode material may be a highly reflective layer and in some instances may be textured.

The invention also includes a method for the manufacture of the photovoltaic device which includes laser ablating the layers of material to form the holes therethrough.

A BRIEF DESCRIPTION OF THE FIGURES

DETAILED DESCRIPTION OF THE INVENTION

Figure 1:
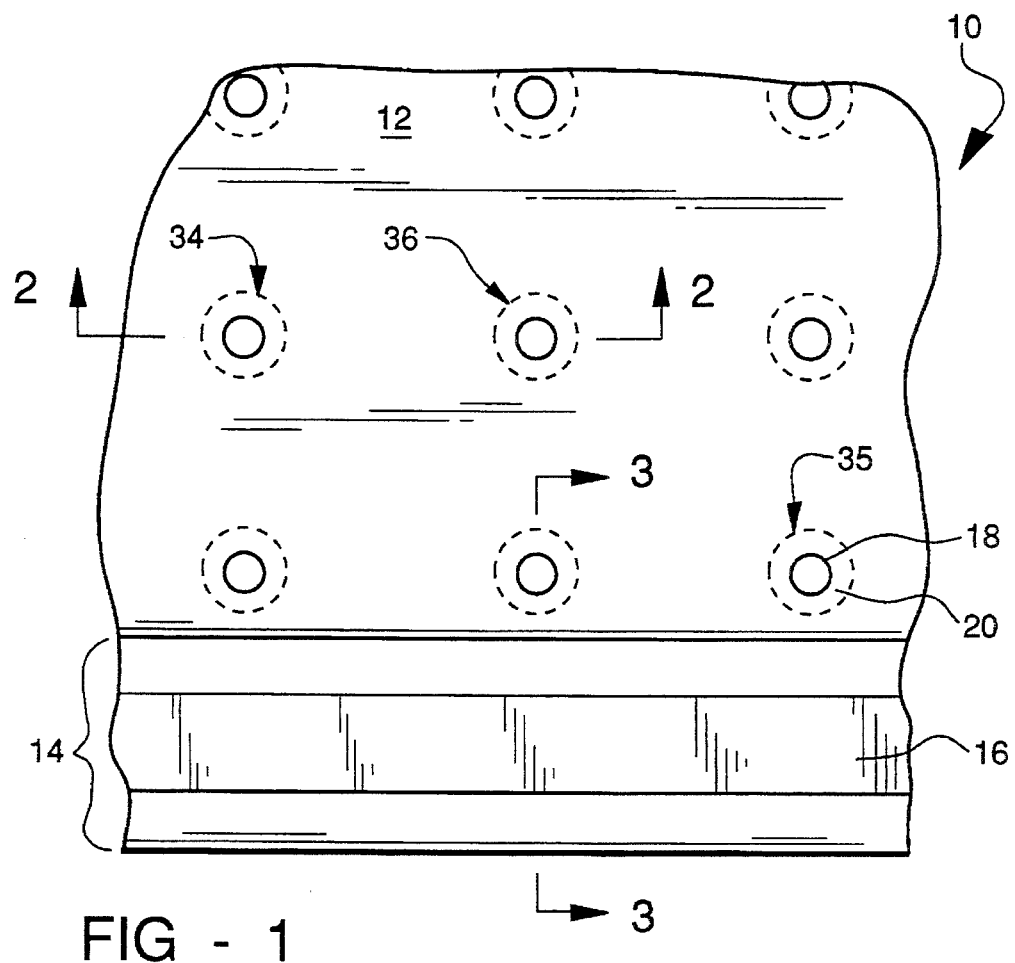
FIG. 1 is a top, plan view of a portion of a photovoltaic device structured in accord with the principles of the present invention.

The present invention relates to a large area of photovoltaic device which is comprised of a number of photovoltaically active regions interconnected in a parallel electrical relationship. Referring now to FIG. 1, there is shown a top, plan view of a large area device 10 structured in accord with the present invention. Shown in the drawing is a photovoltaically active portion 12 of the device 10; as well as an edge portion 14 which includes a current collecting bus bar 16 thereupon. It will be noted that the photovoltaically active region 12 includes a number of through hole connections defined therein, as will be explained in greater detail hereinbelow, each of the through hole connections, for example through hole connection 35, includes a first hole 20, and an associated second hole 18, concentric therewith. As will be explained in greater detail hereinbelow, the first hole 20, in the finished device, covered by a number of overlying layers of material, and in the drawing of FIG. 1 is shown in phantom outline. Each of the through hole connections provides a conductive path whereby photocurrent from the top electrode of the device 10 may be conveyed to a bottom electrode for collection. Each of the through hole connections collects current from a region thereabout, as will be determined by the lateral resistivity of the surrounding layers, and as such, each through hole connection defines a photoactive photovoltaic region, generally configured as a circular region centered thereabout. The device 10 of FIG. 1 is thus comprised of a number of such photovoltaic regions electrically connected in a parallel relationship.

Figure 2:
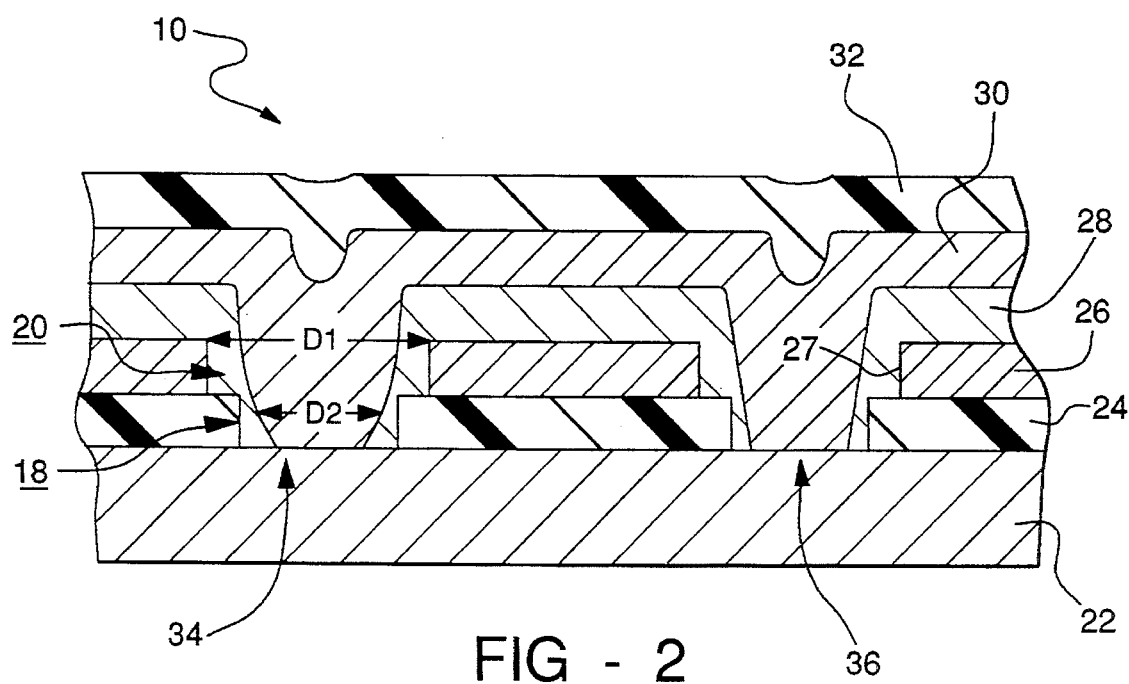
FIG. 2 is a cross-sectional view of the device of FIG. 1 taken along line II—II.

Referring now to FIG. 2, there is shown a cross sectional view of the device 10 of FIG. 1, taken along line II—II. Device 10 includes an electrically conductive substrate 22, and in accord with the present invention, this substrate is a monolithic, metal substrate member, said term being defined to include a substrate which is relatively thick in cross section, compared to the overlying layers. The substrate of the present invention forms one current collecting electrode of the device, and it is in electrical communication with the top, transparent electrode thereof; furthermore, it is at least fifty and generally one hundred times thicker than any of the overlying individual semiconductor or electrode layers of the device. The substrate 10 is a generally self supporting member typically fabricated from sheet metal having a thickness of at least 1 Mil. In contrast, the overlying layers have a total thickness which is usually no more than several microns; although for clarity of the illustration, the thickness of the layers is exaggerated. While the substrate 10 has no upper limit on thickness, in the interest of material economy, ease of handling and maintenance of flexibility, it will most generally be preferred that the substrate 10 be less than 1 millimeter in thickness and most preferably have a thickness in the range of 3–10 Mils. The substrate 22 may be fabricated from any electrically conductive metal and is most preferably fabricated from stainless steel, brass, copper, aluminum or any other such low cost metal having good electrical conductivity. In some instances, the substrate 22 may include a further backing or support layer, and all such substrates are encompassed within the definition of monolithic substrates in accord with the present disclosure.

Disposed upon the substrate 22 is an electrically insulating coating 24. The insulating coating 24 may be formed from an organic polymeric material such as polyimide, and one particular polyimide having utility in the present invention is a material sold under the name Kapton® by the Dow Chemical Company. Insulating regions may also be formed from an inorganic material such as silicon oxide, silicon nitride, aluminum oxide, or various combinations thereof. In some particular instances, the insulating layer 24 may be derived from the substrate 22 by process of oxidation, nitriding or the like. In one particularly preferred process, the insulating layer 24 is deposited by a microwave energized chemical vapor deposition process, although it is to be understood that other vacuum deposition processes such as evaporation, sputtering and the like may be employed. Disposed atop the insulating layer 24 is a bottom electrode layer 26. Layer 26 is typically fabricated from a metallic material, preferably a material having good electrical conductivity. In one particularly preferred embodiment, the bottom electrode layer 26 is fabricated from a highly reflective metal which enhances the efficiency of the photovoltaic device by directing non-absorbed light back through the overlying photovoltaic body to increase light absorption. As is well known in the art, the reflective surface of the layer 26 may be texturized so as to increase light scattering therefrom. The bottom electrode layer 26 may be fabricated from a highly reflective metal such as silver or copper, or it may be a composite body fabricated from a layer of less reflective metal covered with a layer of silver or copper. In some instances, the bottom electrode layer may include protective and/or texturizing layers fabricated from transparent, electrically conductive materials, and within the context of this disclosure, the bottom electrode layer 26 shall be defined to include any layer, or collection of layers, which are disposed upon the insulating layer 24 and provide one of the electrodes of the photovoltaic device.

Disposed atop the bottom electrode layer 26 is a photovoltaic body 28. The photovoltaic body 28 operates to absorb incident photons and generate an electrical current in response thereto. The photovoltaic body 28 may comprise any one of a number of photovoltaic materials such as silicon, silicon alloys, gallium arsenide, $CuInSe_2$, and CdS, among others. One particularly preferred photovoltaic material comprises thin film alloys of silicon and/or silicon-germanium. These materials may be fabricated into P-I-N-type photovoltaic devices wherein a layer of substantially intrinsic alloy material is interposed between oppositely doped semiconductor layers. In some instances, a plurality of such P-I-N triads may be stacked atop one another to provide increased photovoltaic conversion efficiency. Within the context of this disclosure, the term photovoltaic body shall include any layer or aggregation of layers of semiconductor material which generates a flow of electrical current in response to the absorption of illumination thereby.

The device 10 further includes a transparent, electrically conductive layer 30 which forms a top electrode for the photovoltaic device. The transparent, electrically conductive layer 30 is most preferably a layer of a transparent, electrically conductive metal oxide (TCO) such as indium oxide, tin oxide, zinc oxide, cadmium oxide or combinations thereof.

Finally, it will be noted that the device includes a top encapsulant layer 32. This layer is electrically insulating and optically transparent and serves to protect underlying portions of the device. In some instances, the encapsulant layer 32 may be an organic polymeric material. One particularly preferred group of materials comprises fluoropolymers. In other instances, the protective layer may comprise a layer of inorganic material such as a layer of silicon oxide, silicon nitride, silicon carbide, boron carbide and the like. It has been found that inorganic layers, as described hereinabove, when employed at thicknesses of 10 microns or greater provide a very good barrier to water penetration.

Figure 3:
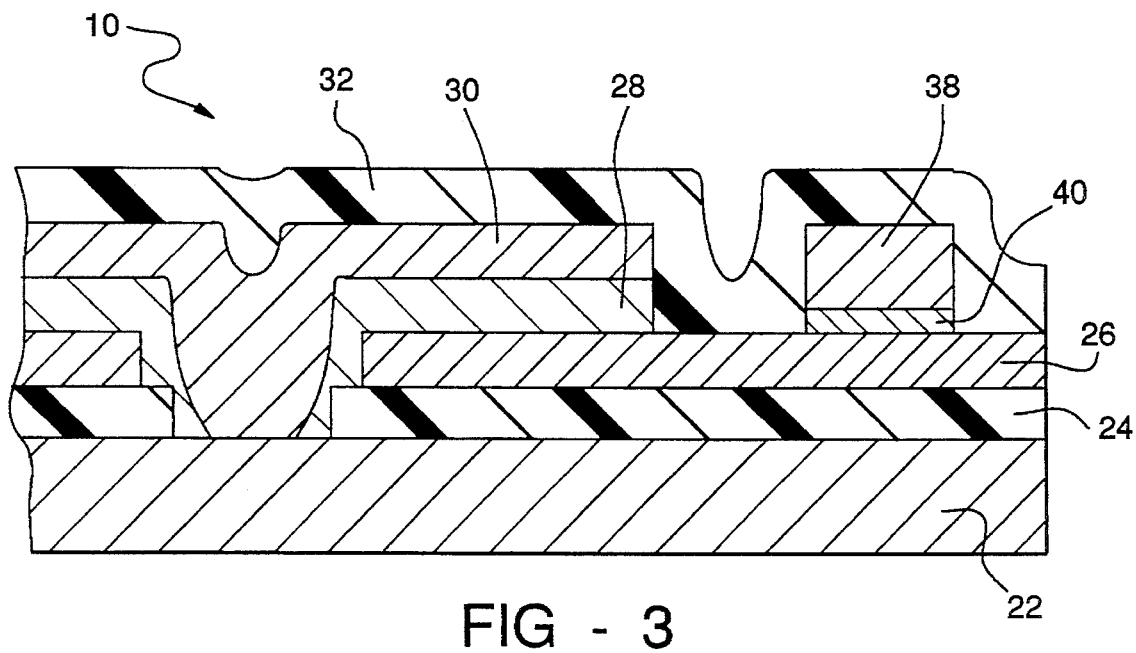
FIG. 3 is a cross-sectional view of the device of FIG. 1 taken along line III—III.

It will be noted that the device 10 of FIG. 2 further includes two through hole connections 34, 36 therethrough. As will be described in greater detail hereinbelow, each of the through hole connections 34, 36 includes a first hole 20 defined through the bottom electrode layer 26. This first hole 20 has a diameter $D_1$ and it exposes an edge portion 27 of the bottom electrode layer 26, about the periphery thereof. The through hole connections further include a second hole 18 defined through the semi-conductor body 28 and insulating layer 24. This second hole 18 has a diameter $D_2$, which is less than $D_1$. The first hole 20 is partly filled by the semi-conductor body 28 which covers, and surrounds the edge portions 27 of the bottom electrode layer 26 as exposed by the first hole 20. The semiconductor layer 28 may also cover the exposed edges 25 of the insulating layer 24, as illustrated in FIGS. 2 and 3. The transparent, electrically conductive layer 30 fills any unfilled remainder of the first hole 20 at least a portion of and the second hole 18 and establishes electrical communication with the substrate 22. In those instances where the semiconductor layer does not cover the exposed edges 25 of the insulating layer 24, the conductive layer 30 will extend to those edges 25.

In the operation of the device 10 incident illumination passes through the top protective layer 32, the transparent conductive electrode 30 and is absorbed by the semiconductor body 28. Unabsorbed protons are reflected back through the semi-conductor body 28 by the reflective surface of the bottom electrode layer 26. As is known in the art, the absorption of photons in the semi-conductor body creates a photocurrent which is collected by the bottom electrode layer 26 and the top, transparent electrically conductive layer 30. The transparent conductive layer 30 has a relatively high electrical restivity, and for that reason the prior art typically included current collecting grid fingers thereupon for providing a low resistance current path thereacross. The present invention eliminates the need for such structures, since the relatively short current path to the electrically conductive substrate 22 is provided by means of the through holes 34, 36. In a typical device, the through holes are spaced approximately 1–5 millimeters apart, hence photocurrent will never have to travel more than 0.5–2.5 millimeters through the transparent conductive material to reach the high conductivity of substrate 36.

Photocurrents are collected from the bottom electrode layer and from the substrate. Referring now to FIG. 3, there is shown a cross sectional view of the device 10 of FIG. 1 taken along line III—III. Visible in this drawing is the substrate 22, insulating layer 24, bottom electrode layer 26, semiconductor body 28, transparent conductive layer 30, and top protective layer 32 as previously described. Also visible in this drawing is a current collecting bus bar 38 comprised of a copper foil strip disposed in electrical communication with the bottom electrode layer 26 by means of an electrically conductive adhesive 40. The current collecting bus bar 38 is disposed at one edge of the device 10 in a region which is outside the active area of the device and does not include the semi-conductor body 28 or transparent top electrode 30. The protective layer 32 may extend over and cover the bus bar 38. In variations of this structure, the bus bar 38 may be affixed to the bottom electrode layer 26 by means of solder, conductive adhesive or the like, and it may comprise wire, metal foil, or the like; in other instances it may be a body of metal deposited by electroplating, vacuum deposition or the like. In still other instances, the bus bar may be formed of an electrically conductive paste or ink. The bus bar 38 forms one terminal of the photovoltaic device and the substrate 22 forms the other. As is known in the art, the bus bar 38 may be further connected to a terminal disposed on an electrically insulated region of the backside of the substrate 22 so as to provide for a photovoltaic device which has all backside connections. Similarly, the substrate connection may be brought around to an insulated region on the front, to provide a front side connected device. Because of the particular structure of the device of the present invention, the need to place any type of opaque current collecting structure on the photoactive region of the device is eliminated. It has been found that when a device generally similar to that shown in FIGS. 1–3 is fabricated utilizing holes having a diameter $D_1$ of approximately 50 microns and a hole to hole spacing of approximately 2 millimeters, the losses due to inactive area amount to only about 1%.

Figure 4:
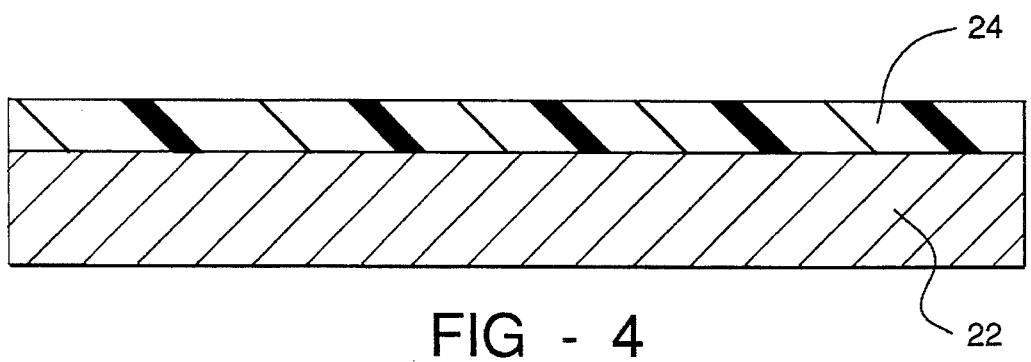
FIGS. 4–8 are cross-sectional views of a photovoltaic device generally similar to that of FIG. 2 taken at different stages in the processing thereof and illustrating the various steps in its manufacture.
Figure 5:
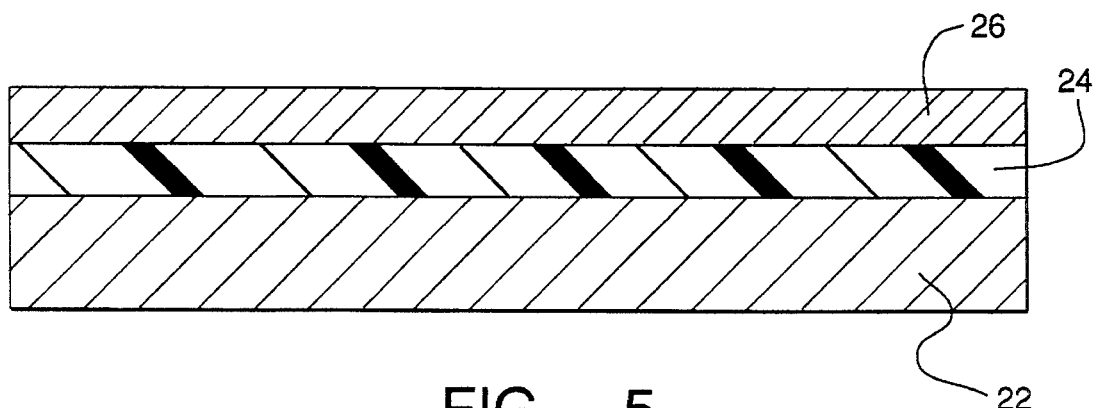

Referring now to FIGS. 4–8, there are shown steps in the fabrication of a photovoltaic device generally similar to that of FIGS. 1–3, and in the figures, similar structures will be indicated by like reference numerals. As shown in FIG. 4, a monolithic, electrically conductive, metallic substrate 22 has an insulating layer 24 applied thereto. The insulating coating 24 may comprise a separate body of a material such as a body of polymeric or inorganic material applied by conventional techniques such as solvent coating, sputtering, evaporation and the like, or it may comprise a body of material derived from the treatment of the substrate 22 as for example by anodizing, nitriding or the like. In the next step, as illustrated in FIG. 5, a layer of electrically conductive bottom electrode material 26 is deposited atop the layer of insulating material 24. The bottom electrode layer 26 is preferably a layer of metal and may be deposited by conventional techniques such as evaporating, sputtering, plating, thermal decomposition of metallic compounds. As noted hereinabove, the bottom electrode layer 26 may comprise a single layer or a plurality of layers.

Figure 6:
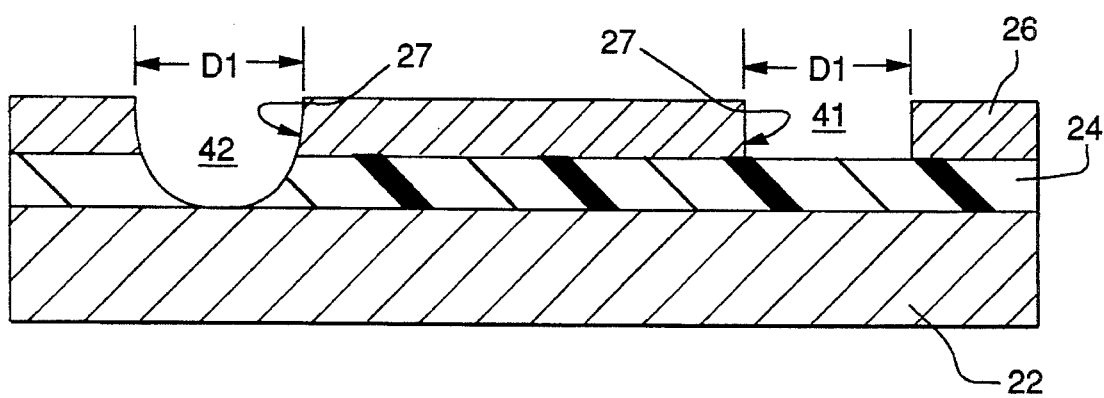

In a subsequent step, as shown in FIG. 6, the bottom electrode layer 26 has a series of holes formed therein, preferably by a laser ablation process. As noted above, the formation of the holes exposes an edge portion 27 of the bottom electrode layer 26. In an idealized situation as shown for the right hand hole 41 of the FIG. 6 embodiment, the hole is defined only through the bottom electrode layer 26, and does not pass into the insulating layer 24. For the sake of clarity in the foregoing illustrations, this first hole was illustrated in this manner; in reality, it is not necessary, and generally difficult, to limit the first hole to the bottom electrode layer 26 solely. The first hole may also pass into, and through, in some instances, the insulating layer 24. The presence of the massive, monolithic substrate 22 of the present invention precludes the need to exercise very precise control of the hole formation process. In general, the energy distribution of the laser beam being used for the ablation process will be gaussian and the hole formed thereby will be more like the one shown in the left hand portion of the FIG. 6 illustration. It will be noted that this hole 42 has a relatively rounded bottom and passes entirely through the bottom electrode layer 26 and partially through the insulating layer 24. The only requirement of the present invention is that the opening formed in the bottom electrode 26 be at least as large as any opening formed in the insulating layer 24.

Figure 7:
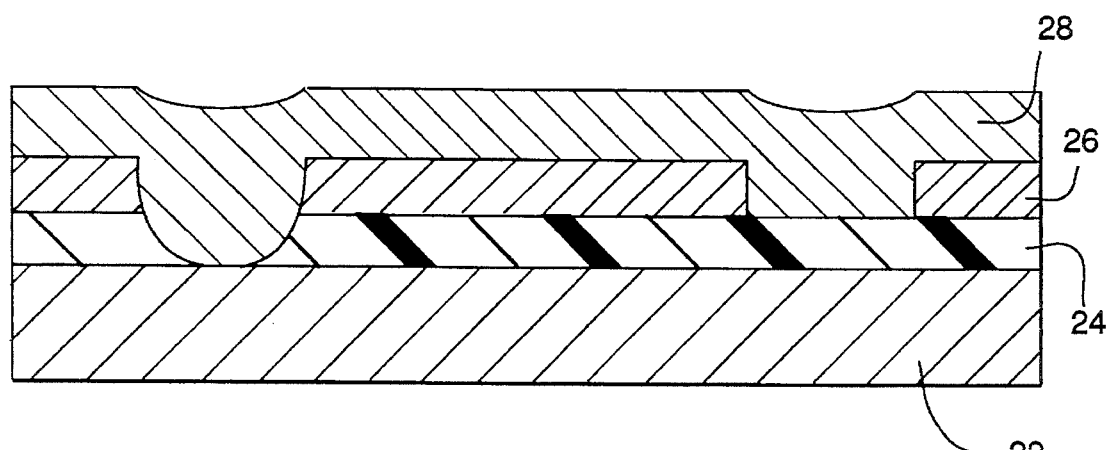

FIG. 7 illustrates the next step in the process wherein the semi-conductor body 28 is deposited. This body 28 is deposited so as to cover the entirety of the device and fill in the first holes. The semi-conductor body 28 covers the edges 27 of the bottom electrode layer 26 which are exposed in the first holes after laser ablation. In this manner, the bottom electrode layer is effectively covered on all sides by the semi-conductor body 28 and the insulating layer 24. As noted above, the semiconductor 28 may comprise a plurality of variously doped semiconductor layers, and in one preferred embodiment includes at least one triad of n-i-p configuration.

Figure 8:
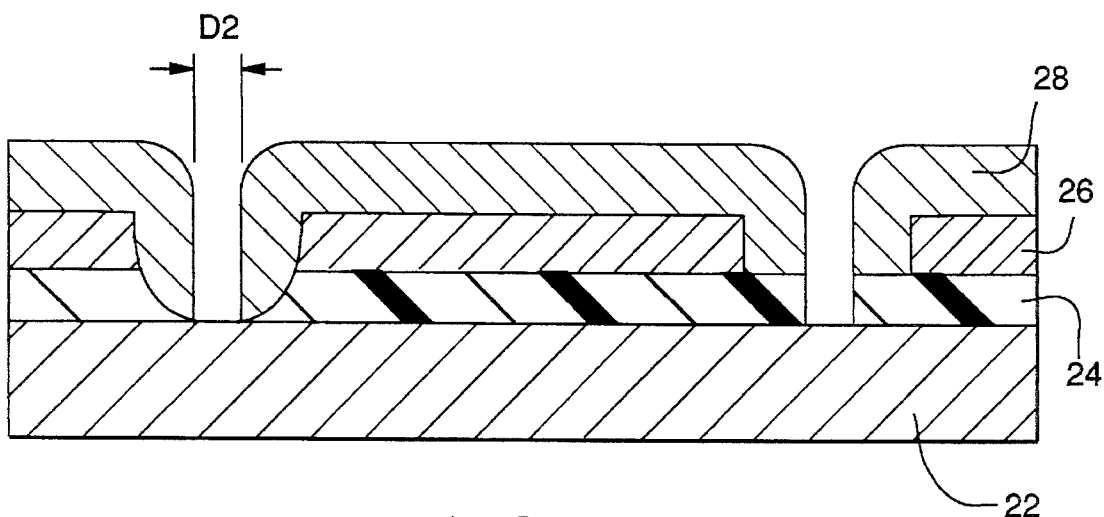

In a subsequent processing step as shown in FIG. 8, a second set of holes is formed in the device preferably by laser ablation. This second set of holes is generally concentric with the holes of the first set and has a diameter $D_2$ which is less than the diameter $D_1$ of the holes of the first set. By generally concentric, is meant that each of these second holes is disposed within a corresponding first hole so that the edges 27 of the bottom electrode layer remain protected by the semiconductor body; it is not necessary that the holes be precisely centered, provided such protection is maintained. The second hole passes entirely through the semiconductor body 28 and through the thickness of the subjacent insulating layer 24, if any, so as to expose a portion of the substrate 22 at the bottom thereof.

In a final step, not illustrated, a layer of transparent conductive material is deposited atop the entire area of the device so as to fill the second holes. The layer of transparent conductive material thereby establishes electrical communication between the top surface of the semiconductor body 28 and the substrate 22, through the holes. In this manner, a body of semiconductor material is configured as a plurality of photovoltaic regions interconnected in a parallel relationship to provide a large area device. This device may subsequently be interconnected to other devices in a series or parallel fashion. By so configuring the photovoltaic material, current is effectively collected without the need for placing opaque structures atop the device. Furthermore, the configuration of the device permits ready removal of a defective region by scribing, etching or any other such removal process. In this manner, very large area, highly efficient, relatively low voltage, high amperage photovoltaic devices may be fabricated. Such devices may be used for water electrolysis or other such electrochemical processes, or they may be interconnected in series to provide high voltage, high amperage power generators.

The spacing of the through holes will depend upon a balance of the resistivity of the top conductive electrode, the size of the through holes, and the electrical characteristics of the device. Resistivity loss for the top surface of a device generally similar to that shown herein may be calculated by the following formula:

$$I^2 R = \frac{\pi}{2} \rho_\square J^2 \left[ r_d^4 \ln\left(\frac{r_d}{r_o}\right) + \frac{r_d^4}{4} - \frac{r_o^4}{4} - r_d^4 + r_d^2 r_o^2 \right]$$

wherein $\rho_\square$ is the sheet resistance of the transparent conductive electrode, J is the current density of the cell $r_d$ is one half of the spacing between dots and $r_o$ is the radius of the dot, generally defined as $D_1$ hereinabove.

Similarly, the resistivity of the bottom electrode will also determine the efficiency of the device since all photogenerated current must pass through this electrode. It has been found that the resistive loss for the back electrode may be calculated by the formula:

$$I^2 R = \rho_\square J^2 w \frac{L^3}{3}$$

wherein $\rho_\square$ is the sheet resistance of the bottom electrode J is the current density of the cell, W is the width of the cell and L its length.

By utilizing the above referenced equations, the layer thickness and hole spacing may be optimized. In general, the hole spacing will be in the approximate range of 0.5 to 10 mm; and more preferably 1 to 5 mm. The method and structure of the present invention provides for a highly efficient photovoltaic device having a very large active area. The through hole contact configuration and method minimizes laser processing steps thereby saving time and preventing damage resultant from crystallization, thrown material, overheating and the like. The use of a massive metal substrate obviates the need for a precisely controlling the ablation step and maximizes yield in production of the devices. The fact that the metal is scribed prior to semiconductor scribing further reduces shorts and shunts which are due to the flow of molten metal. It is to be understood that the present invention may be practiced with a variety of semiconductor and electrode materials, and while one particular configuration of device has been described, the techniques of the present invention may be incorporated into the fabrication of a variety of other devices.

In view of the foregoing, it is clear that the invention may be practiced in a variety of configurations and employing a number of steps different from those depicted and described herein. All of such variations and modifications are within the scope of the invention. The foregoing drawings, discussions and descriptions are meant to be illustrative of particular embodiments of the invention and are not meant to be limitations upon the practice thereof. It is the following claims, including all equivalents, which define the scope of the invention.

We claim:

1. A large area photovoltaic device comprising:

a monolithic, metal substrate member;

an electrically insulating layer disposed upon a top surface of said substrate member;

a bottom electrode layer disposed upon a top surface of said electrically insulating layer, said bottom electrode layer having a first plurality of first holes, each with a diameter $D_1$, in the range of 25–75 microns defined therethrough, so as to expose an edge portion of said bottom electrode layer about the periphery of each of said first holes, said first holes being spaced apart by a distance in the range of 1–5 millimeters;

a semiconductor body disposed upon a top surface of the bottom electrode layer, said semiconductor body at least partially filling each of said first holes so as to cover the edge portion of the bottom electrode layer, said semiconductor body including a second plurality of second holes defined therethrough, each of said second holes being generally concentric with one of said first holes and having a diameter "$D_2$" which is less than $D_1$, and is the range of 10–50 microns, each of said second holes also passing through said electrically insulating layer and having a portion of said substrate exposed at the bottom thereof; and a transparent, electrically conductive layer disposed atop said semiconductor body, said transparent, electrically conductive layer at least partially filling said second hole and establishing electrical contact with the portion of said substrate exposed therein.

2. A photovoltaic device as in claim 1, wherein said substrate member has a thickness in the range of 3–10 mils.

3. A photovoltaic device as in claim 1, wherein said substrate member is stainless steel.

4. A photovoltaic device as in claim 1 further including a first electrical terminal in electrical communication with said substrate member and a second electrical terminal in communication with said bottom electrode.

5. A photovoltaic device as in claim 1, further including an encapsulant layer disposed atop said transparent conductive layer.

6. A photovoltaic device as in claim 5, wherein said encapsulant layer is an inorganic encapsulant layer.

7. A photovoltaic device as in claim 1, wherein said semiconductor body includes a triad comprised of a layer of substantially intrinsic semiconductor material interposed between oppositely doped layers of semiconductor material.

8. A photovoltaic device as in claim 7, wherein said semiconductor body comprises at least two of said triads disposed in a stacked relationship.

9. A photovoltaic device as in claim 1, wherein said semiconductor layer includes at least one layer of a hydrogenated Group IVA semiconductor material.

10. A photovoltaic device as in claim 1, wherein said insulating layer comprises a layer of a material selected from the group consisting of: silicon oxide, silicon nitride, aluminum oxide and combinations thereof.

11. A photovoltaic device as in claim 1, wherein the layer of bottom electrode material is a metallic body having a highly reflective surface.

12. A photovoltaic device as in claim 11, wherein said reflective surface is a textured surface.

* * * * *